United States Patent
Lin et al.

(10) Patent No.: US 11,057,999 B2
(45) Date of Patent: Jul. 6, 2021

(54) MOTHERBOARD AND MEMORY MODULE

(71) Applicant: ASUSTeK COMPUTER INC., Taipei (TW)

(72) Inventors: Bing-Min Lin, Taipei (TW); Ji-Kuang Tan, Taipei (TW); Chen-Wei Fan, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/394,143

(22) Filed: Apr. 25, 2019

(65) Prior Publication Data
US 2019/0350080 A1 Nov. 14, 2019

(30) Foreign Application Priority Data
May 8, 2018 (TW) .................... 107115616

(51) Int. Cl.
*H05K 1/14* (2006.01)
*H05K 1/11* (2006.01)
*H01R 12/73* (2011.01)

(52) U.S. Cl.
CPC ........... *H05K 1/141* (2013.01); *H01R 12/737* (2013.01); *H05K 1/117* (2013.01); *H05K 2201/049* (2013.01); *H05K 2201/10159* (2013.01); *H05K 2201/10189* (2013.01)

(58) Field of Classification Search
CPC .. H05K 1/141; H05K 1/117; H05K 2201/049; H05K 2201/10159; H05K 2201/10189; G11C 5/04
See application file for complete search history.

(56) References Cited

U.S. PATENT DOCUMENTS

| | | | |
|---|---|---|---|
| 7,298,625 B1 | 11/2007 | Wu et al. | |
| 8,130,560 B1 * | 3/2012 | Rajan ................. | G06F 13/1678 365/189.03 |
| 9,076,500 B2 | 7/2015 | Osanai et al. | |
| 9,948,143 B2 | 4/2018 | Abe | |

(Continued)

FOREIGN PATENT DOCUMENTS

| | | |
|---|---|---|
| CN | 104604092 B | 5/2017 |
| TW | M320747 | 10/2007 |
| TW | 201342388 A | 10/2013 |

*Primary Examiner* — Mohammed A Bashar
(74) *Attorney, Agent, or Firm* — McClure, Qualey & Rodack, LLP

(57) ABSTRACT

A motherboard is provided. The motherboard includes a memory module, a processor and a memory slot. The memory module includes a first memory rank, a second memory rank, a plurality of first pins coupled to the first memory rank and a plurality of second pins coupled to the second memory rank. The processor includes a memory channel. The memory slot is coupled between the processor and the memory module, and is configured to transmit a first control signal from the memory channel to at least one of the plurality of first pins, or transmit a second control signal from the memory channel to at least one of the plurality of second pins. The first memory rank receives the first control signal through at least one of the plurality of first pins. The second memory rank receives the second control signal through at least one of the plurality of second pins.

8 Claims, 4 Drawing Sheets

(56) References Cited

U.S. PATENT DOCUMENTS

| | | | |
|---|---|---|---|
| 2008/0098277 A1* | 4/2008 | Hazelzet | H03M 13/19 |
| | | | 714/753 |
| 2010/0070694 A1* | 3/2010 | Chin | G06F 13/409 |
| | | | 711/104 |
| 2017/0337144 A1* | 11/2017 | Ware | G06F 9/4843 |

* cited by examiner

MOTHERBOARD AND MEMORY MODULE

CROSS-REFERENCE TO RELATED APPLICATION

This application claims the priority benefit of Taiwan Application Serial No. 107115616, filed on May 8, 2018. The entirety of the above-mentioned patent application is hereby incorporated by reference herein and made a part of specification.

BACKGROUND OF THE INVENTION

Field of the Invention

The disclosure relates to a motherboard and a memory module, and more particularly, to the configuration of signal transmission paths for a motherboard and a memory module.

Description of the Related Art

In current mainstream motherboards, one memory channel in a processor supports two memory modules to satisfy the requirement of a large memory capacity. If a processor supporting the dual-channel transmission technology is arranged on a motherboard having four memory slots, four memory modules are able to be inserted on the motherboard at maximum. However, for each two memory modules are connected to the same memory channel, and the memory module farther away from the processor performs data transmission with the processor by a long flat cable. As a result, when one memory channel is connected to two memory modules, the memory module farther away from the processor has poor signal transmission quality, and therefore the overclocking stability is lowered while overclocking function is required.

BRIEF SUMMARY OF THE INVENTION

According to the first aspect of the disclosure, a motherboard is provided herein. The motherboard includes: a memory module, a processor and a memory slot. The memory module comprises a first memory rank; a second memory rank; a plurality of first pins, coupled to the first memory rank; and a plurality of second pins, coupled to the second memory rank. The processor comprises a memory channel. The memory slot is coupled between the processor and the memory module, and configured to transmit a first control signal from the memory channel to at least one of the plurality of first pins, or transmit a second control signal from the memory channel to at least one of the plurality of second pins. The first memory rank receives the first control signal through at least one of the plurality of first pins, and the second memory rank receives the second control signal through at least one of the plurality of second pins.

According to the second aspect, a memory module applied to a motherboard is provided herein. The memory module includes a first memory rank; a second memory rank; a plurality of first pins, coupled to the first memory rank and configured to receive a first control signal; and a plurality of second pins, coupled to the second memory rank and configured to receive a second control signal, wherein the first memory rank receives the first control signal through at least one of the plurality of first pins, and the second memory rank receives the second control signal through at least one of the plurality of second pins.

The motherboard and the memory module disclosed herein not only support a large memory capacity, but also keep the overclocking stability.

BRIEF DESCRIPTION OF THE DRAWINGS

To make the foregoing and other objectives, features, advantages, and embodiments of the disclosure more comprehensible, descriptions of the accompanying drawings are as follows.

DETAILED DESCRIPTION OF THE EMBODIMENTS

Figure 1:
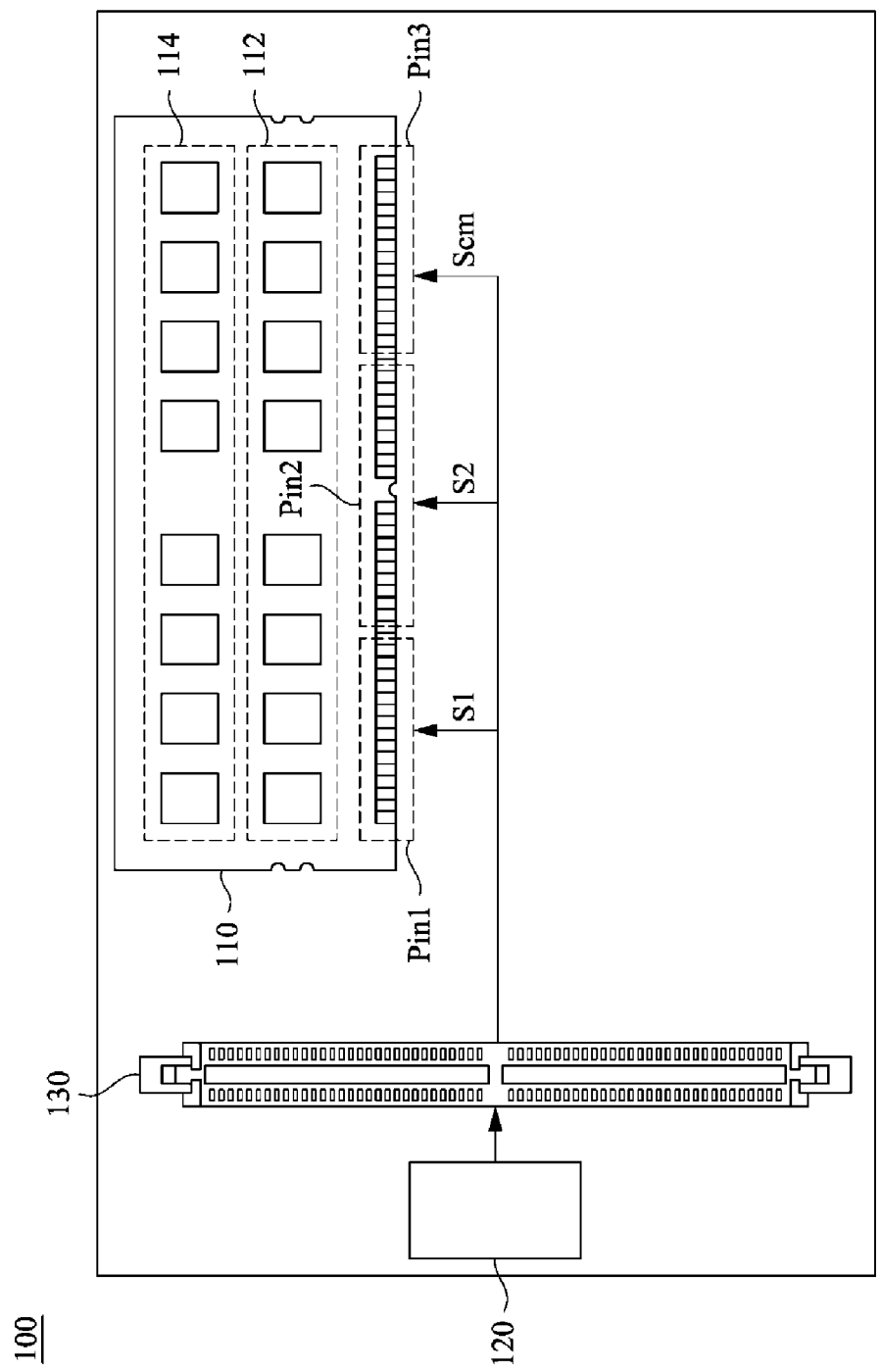
FIG. 1 is a schematic simplified view of a motherboard according to an embodiment of the disclosure.

Embodiments of the disclosure are illustrated below with reference to the relevant drawings. In the drawings, same reference numerals denote the same or similar element or method procedure.

Referring to FIG. 1, a motherboard 100 includes a memory module 110, a processor 120 and a memory slot 130. The memory module 110 is inserted in the memory slot 130. The motherboard 100 supports a large memory capacity and keeps the overclocking stability. For the simplicity of illustration and ease of description, other elements in the motherboard 100 and a corresponding connection relationship are not shown in FIG. 1.

The memory module 110 includes a first memory rank 112, a second memory rank 114, a plurality of first pins pin1, a plurality of second pins pin2 and a plurality of third pins pin3. The plurality of first pins pin1 is coupled to the first memory rank 112, the plurality of second pins pin2 is coupled to the second memory rank 114, and the plurality of third pins pin3 is coupled to the first memory rank 112 and the second memory rank 114.

In the embodiment, the first memory rank 112 and the second memory rank 114 are located on the same surface of the memory module 110, and the first memory rank 112 is located between the second memory rank 114 and pins (e.g., the first pins pin1, the second pins pin2 and the third pins pin3). In another embodiment, the first memory rank 112 and the second memory rank 114 are arranged on each of two opposite surfaces of the memory module 110 at the same time, which means that the memory module 110 includes two first memory ranks 112 and two second memory ranks 114. In still another embodiment, the first memory rank 112 and the second memory rank 114 are located on different surfaces of the memory module 110.

The arrangement of the plurality of first pins pin1, the plurality of second pins pin2 and the plurality of third pins pin3 shown in the drawings of the disclosure are provided for ease of illustration, but not limited herein. In an embodiment, the first pins pin1 are arranged between the second pins pin2 and/or the third pins pin3. In other embodiment, the second pins pin2 are arranged between the first pins pin1 and/or the third pins pin3.

In addition, the memory module 110 supports the double data rate third generation (DDR3) transmission format or the double data rate fourth generation (DDR4) transmission format, but the disclosure is not limited thereto. The design concept of the memory module 110 provided in the disclosure t is also supporting subsequent developed new-generation double data rate transmission formats such as the double data rate fifth generation (DDR5) transmission format.

The memory slot 130 is coupled between the processor 120 and the memory module 110. The processor 120 has at least one memory channel. In an embodiment, the memory slot 130 is receives a first control signal S1, a second control signal S2 and a common signal Scm from the memory channel of the processor. Then, the memory slot 130 transmits the first control signal S1 to at least one of the plurality of first pins pin1, transmits the second control signal S2 to at least one of the plurality of second pins pin2, and transmits the common signal Scm to at least one of the plurality of third pins pin3.

In other words, the first memory rank 112 receives the first control signal S1 through at least one of the plurality of first pins pin1 but does not receive the second control signal S2. The second memory rank 114 receives the second control signal S2 through at least one of the plurality of second pins pin2 but does not receive the first control signal S1. In addition, the first memory rank 112 and the second memory rank 114 receive the common signal Scm through at least one of the plurality of third pins pin3. Therefore, the first memory rank 112 and the second memory rank 114 are ranks independent of each other. The processor accesses the first memory rank 112 or the second memory rank 114 by using the first control signal S1, the second control signal S2 and the common signal Scm.

In an embodiment, the first control signal S1 is a chip select (CS) signal, an on-die termination (ODT) signal, a clock (CLK) signal, a clock enable (CKE) signal or the like exclusive for the first memory rank 112. The second control signal S2 is a chip select signal, an on-die termination signal, a clock signal or the like exclusive for the second memory rank 114. The common signal Scm is a data signal, an address signal or the like adapted for the first memory rank 112 and the second memory rank 114.

Figure 2:
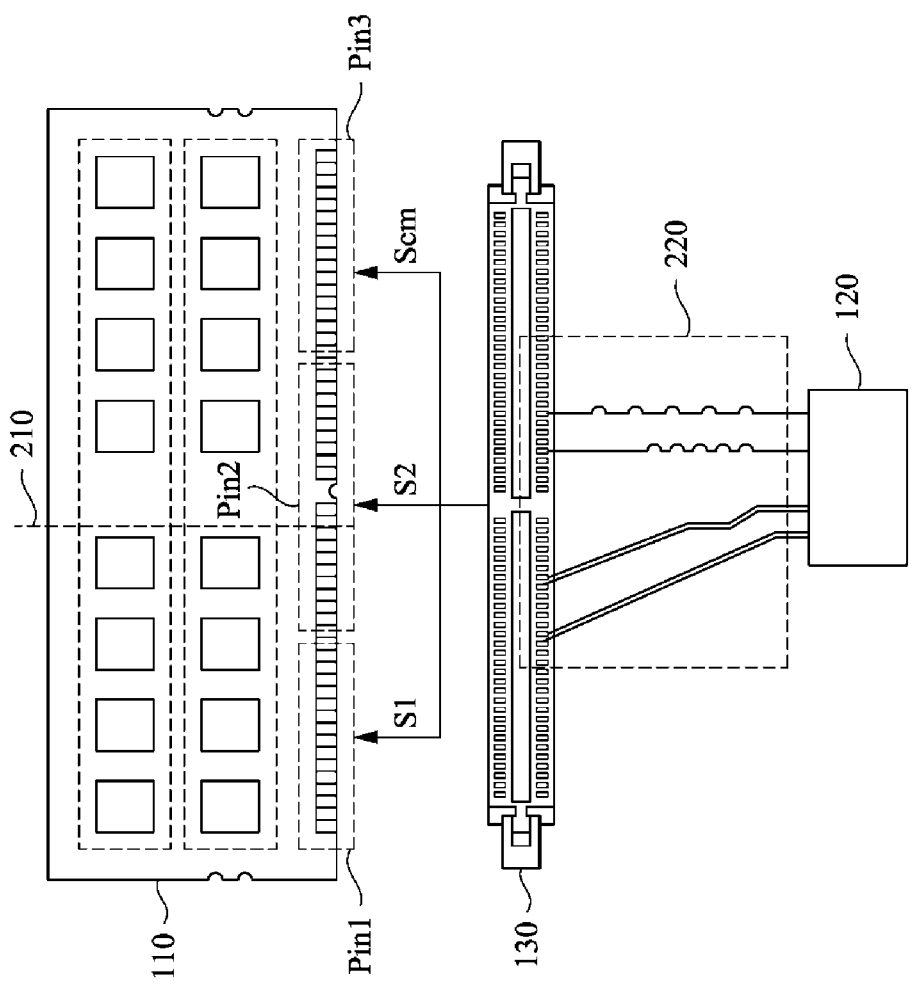
FIG. 2 is a schematic simplified view of an element connection relationship of the motherboard according to an embodiment of the disclosure.

The configuration of the first pins pin1, the second pins pin2 and the third pins 3 is illustrated in FIG. 2. In a Dynamic Random Access Memory (DRAM), the first pins pin1 and the third pins pin3 are configured to transmit signal, and the second pins pin2 are empty pins of the DRAM without transmitting signal.

In one embodiment, the memory module 110 is a memory module supporting the DDR4 transmission format, and the plurality of second pins pin2 includes a plurality of pins selected from pins No. 47 to 93 and No. 192 to 239 of the memory module 110. More specifically, the plurality of second pins pin2 includes pins No. 49, 54, 56, 194, 199, 201, 227, 230, 235 and 237 of the memory module 110. In other embodiments, the memory module 110 is a memory module supporting other generations of double data rate transmission modes, and the second pins pin2 are some empty pins without transmitting signal in the memory module.

The plurality of second pins pin2 is adjacent to a center line 210 of the memory module 110, and when the memory module 110 is inserted in the memory slot 130, a relatively short distance exists between the plurality of second pins pin2 and the processor 120. Therefore, a signal transmission path 220 between the processor 120 and the memory slot 130 for transmitting signal to the plurality of second pins pin2 is short, so that the signal transmission quality between the second memory rank 114 and the processor 120 is improved, thereby keeping the overclocking stability of the motherboard 100.

In addition, a signal transmission path between the processor 120 and the memory slot 130 for transmitting signal to the first pins pin1 and the third pins pin3 is an optimum signal transmission path in a DRAM module.

Figure 3:
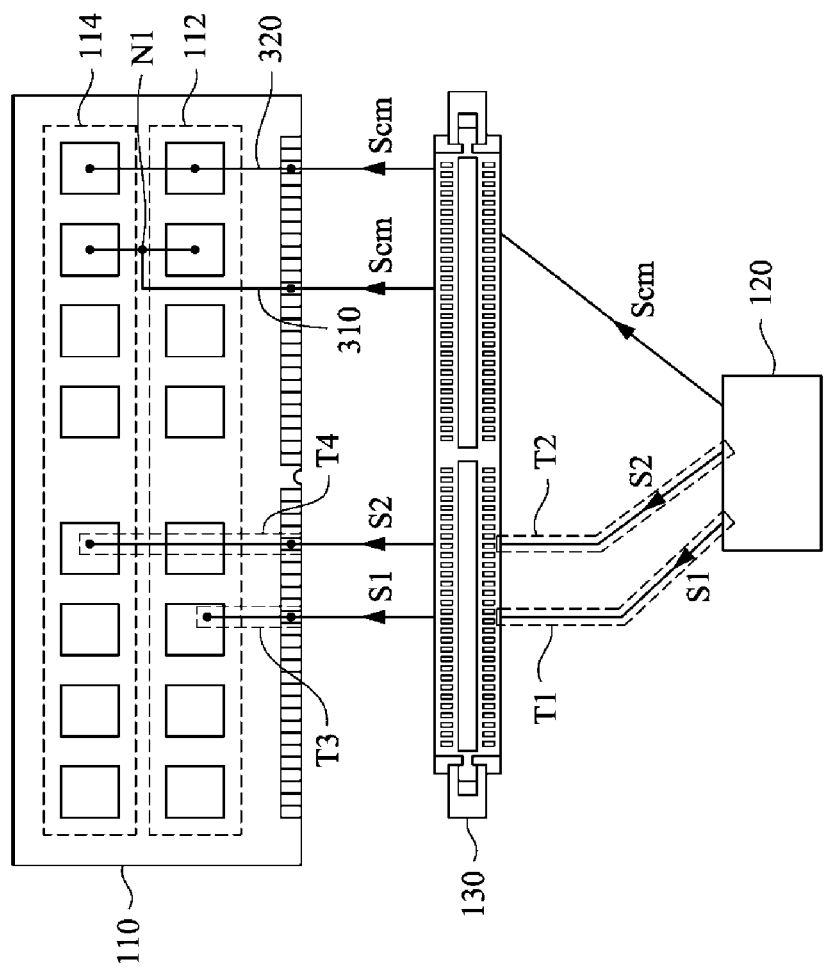
FIG. 3 is a schematic view of a signal transmission path of a memory module according to an embodiment of the disclosure.

Referring to FIG. 3, signal transmission paths (namely paths used for transmitting the common signal Scm) from the third pins pin3 to the first memory rank 112 and the second memory rank 114 jointly form a T-topology path 310 or series path 320. In the T-topology path 310, the common signal Scm is firstly transmitted to a first node N1 from at least one of the third pins pin3 and then transmitted from the first node N1 to the first memory rank 112 and the second memory rank 114. In the series path 320, the common signal Scm is firstly transmitted to the first memory rank 112 from at least one of the third pins pin3 and then transmitted from the first memory rank 112 to the second memory rank 114.

For design of the signal transmission path, a length of the signal transmission path from the third pins pin3 to the first memory rank 112 is made equal to a length of the signal transmission path from the third pins pin3 to the second memory rank 114 as much as possible. In addition, the shorter signal transmission path provides higher signal transmission quality. If the length of the signal path from the third pins pin3 to the second memory rank 114 is different from the length of the signal path from the third pins pin3 to the first memory rank 112 due to limitation of an actual condition, a difference value between the length of the signal path from the third pins pin3 to the second memory rank 114 and the length of the signal transmission path from the third pins pin3 to the first memory rank 112 should not be greater than a deviation value, so as to avoid affecting the signal transmission quality.

In one embodiment, when the signal transmission paths from the third pins pin3 to the first memory rank 112 and the second memory rank 114 jointly form the T-topology path 310, the length of the signal transmission path from the third pins pin3 to the first memory rank 112 is equal to the length of the signal transmission path from the third pins pin3 to the second memory rank 114.

In another embodiment, the signal transmission paths from the third pins pin3 to the first memory rank 112 and the second memory rank 114 form the series path 320, and the length of the signal transmission path from the third pins pin3 to the second memory rank 114 is greater than the length of the signal transmission path from the third pins pin3 to the first memory rank 112, but the difference value between the lengths of the two signal transmission paths does not exceed a deviation value, so as to keep the signal transmission quality between the second memory rank 114 and the processor 120. In an embodiment, the deviation value is 500 mil. Similarly, a length of a signal transmission path from the processor 120 to the second memory rank 114 should not be greater than a length of a signal transmission path from the processor 120 to the first memory rank 112 by more than 500 mil, so as to keep the signal transmission quality between the second memory rank 114 and the processor 120.

As shown in FIG. 3, the first control signal S1 and the second control signal S2 are respectively transmitted from the processor 120 to the memory slot 130 through a first signal transmission path T1 and a second signal transmission path T2. Then, the first control signal S1 is transmitted from the first pins pin1 to the first memory rank 112 through a third signal transmission path T3, and the second control signal S2 is transmitted from the second pins pin2 to the second memory rank 114 through a fourth signal transmission path T4.

As described above, in general, a signal transmission path (e.g., the first signal transmission path T1) between the processor 120 and the memory slot 130 for transmitting signal to the first pins pin1 is an optimum signal transmission path, such as the shortest signal transmission path. Therefore, a length of the second signal transmission path T2 is greater than or equal to that of the first signal transmission path T1. In order to keep the signal transmission quality between the second memory rank 114 and the processor 120, a length of the fourth signal transmission path T4 needs to be adjusted according to a difference value between the length of the first signal transmission path T1 and the length of the second signal transmission path T2, so that a difference value between total lengths of signal transmission paths of the first control signal S1 and the second control signal S2 is within a reasonable range.

In an embodiment, a difference between the length of the first signal transmission path T1 and the length of the second signal transmission path T2 is X mil, a length of the third signal transmission path T3 is M mil, and the length of the fourth signal transmission path T4 is N mil, where X, M and N are positive numbers. In this case, X mil needs to be subtracted from the length of the fourth signal transmission path T4 firstly, so as to keep the signal transmission quality between the second memory rank 114 and the processor 120. Then, under the situation that without unduly affecting the signal transmission quality of the second memory rank 114, J mil is added to the length of the fourth signal transmission path T4 according to actual requirements, where J is a positive number less than or equal to 500. The length of the fourth signal transmission path T4 is expressed through Formula 1 as follows:

$$N=M-X+J \text{ mil} \quad \text{Formula 1}$$

Figure 4:
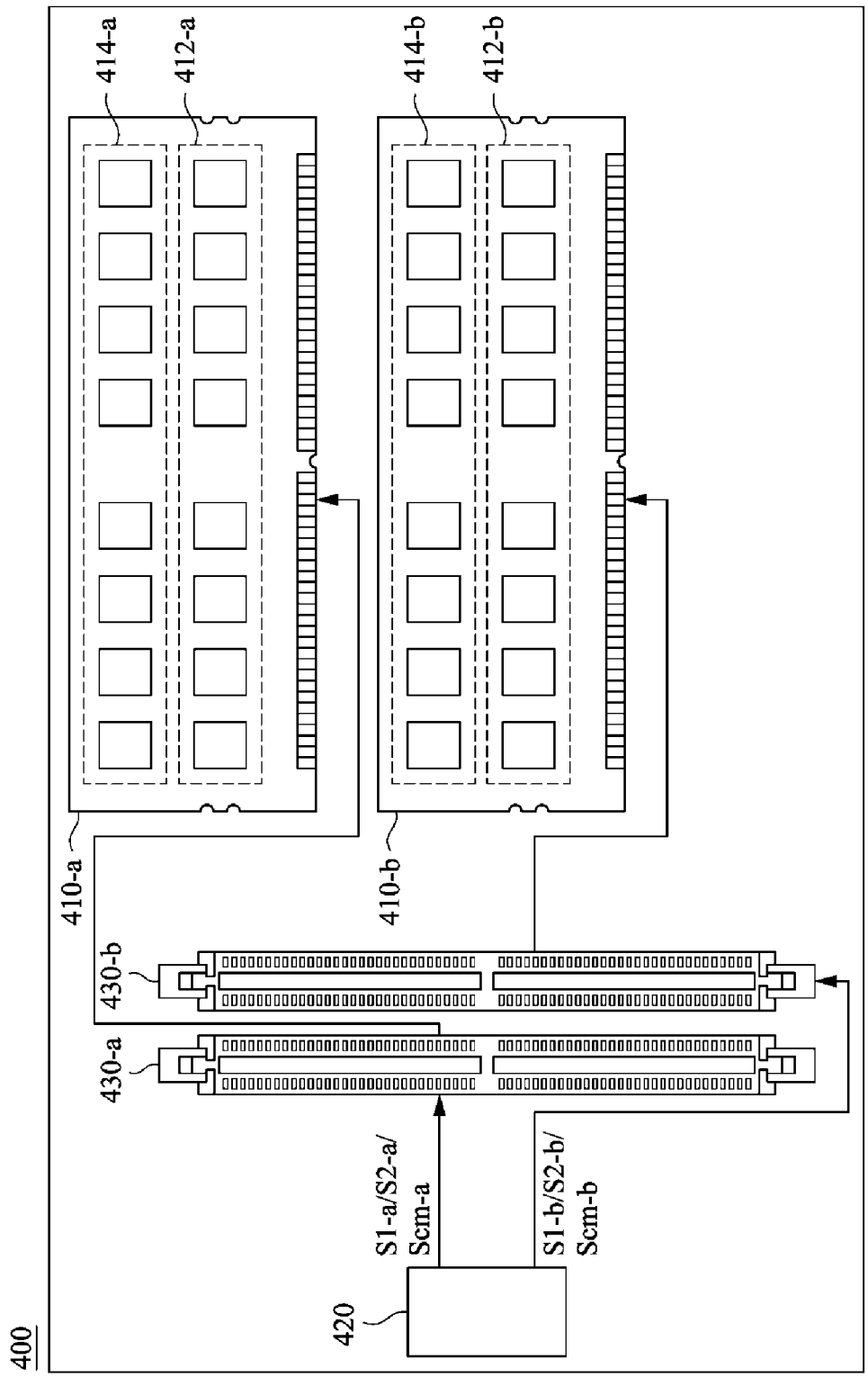
FIG. 4 is a schematic simplified view of a motherboard according to an embodiment of the disclosure.

Referring to FIG. 4, a motherboard 400 includes a memory module 410-*a*, a memory module 410-*b*, a processor 420, a memory slot 430-*a*, and a memory slot 430-*b*, where the memory module 410-*a* is inserted in the memory slot 430-*a*, and the memory module 410-*b* is inserted in the memory slot 430-*b*. For the simplicity of illustration and ease of description, other elements and corresponding connection relationship of the motherboard 400 are not shown in FIG. 4.

In the embodiment, the memory module 410-*a* includes a first memory rank 412-*a* and a second memory rank 414-*a*, where the first memory rank 412-*a* and the second memory rank 414-*a* are located on the same surface of the memory module 410-*a*. In another embodiment, the first memory rank 412-*a* and the second memory rank 414-*a* both are disposed on each of two opposite surfaces of the memory module 110, which means that the memory module 110 includes two first memory ranks 412-*a* and two second memory ranks 414-*a*. In another embodiment, the first memory rank 412-*a* and the second memory rank 414-*a* are located on different surfaces of the memory module 110.

Similarly, the memory module 410-*b* includes a first memory rank 412-*b* and a second memory rank 414-*b*, where the first memory rank 412-*b* and the second memory rank 414-*b* are located on the same surface of the memory module 410-*b*. In another embodiment, the first memory rank 412-*b* and the second memory rank 414-*b* both are disposed on each of two opposite surfaces of the memory module 110, which means that the memory module 110 includes two first memory ranks 412-*b* and two second memory ranks 414-*b*. In another embodiment, the first memory rank 412-*b* and the second memory rank 414-*b* are located on different surfaces of the memory module 110.

The memory slot 430-*a* is coupled between the processor 420 and the memory module 410-*a*, and the memory slot 430-*b* is coupled between the processor 420 and the memory module 410-*b*. The processor 420 has at least two memory channels. The memory slot 430-*a* is configured to transmit a first control signal S1-*a*, a second control signal S2-*a* and a common signal Scm-a from the memory channel of the processor to the memory module 410-*a*. The memory slot 430-*b* is configured to transmit a first control signal S1-*b*, a second control signal S2-*b* and a common signal Scm-b from the memory channel of the processor to the memory module 410-*b*.

The memory module 410-*a* and the memory module 410-*b* are similar to the memory module 110. In an embodiment, in the memory module 410-*a*, the first memory rank 412-*a* receives the first control signal S1-*a* but does not receive the second control signal S2-*a*, the second memory rank 414-*a* receives the second control signal S2-*a* but does not receive the first control signal S1-*a*, and the first memory rank 412-*a* and the second memory rank 414-*a* both receive the common signal Scm-a. In the memory module 410-*b*, the first memory rank 412-*b* receives the first control signal S1-*b* but does not receive the second control signal S2-*b*, the second memory rank 414-*b* receives the second control signal S2-*b* but does not receive the first control signal S1-*b*, and the first memory rank 412-*b* and the second memory rank 414-*b* both receive the common signal Scm-b.

in an embodiment, the first control signal S1-*a* is the chip select signal, the on-die termination signals, the clock signals, the clock enable signals or the like exclusive for the first memory rank 412-*a*, the second control signal S2-*a* is the chip select signal, the on-die termination signal, the clock signal, the clock enable signal or the like exclusive for the second memory rank 414-*a*, the first control signal S1-*b* is the chip select signal, the on-die termination signal, the clock signal, the clock enable signal or the like exclusive for the first memory rank 412-*b*, and the second control signal S2-*b* is the chip select signal, the on-die termination signal, the clock signal, the clock enable signal or the like exclusive for the second memory rank 414-*b*.

In addition, in the motherboard 400, the configuration of lengths of the signal transmission paths of the first control signal S1-*a*, S1-*b* and the second control signal S2-*a*, S2-*b* that transmitted from the processor 420 to the first memory rank 412-*a*, the second memory rank 414-*a*, the first memory rank 412-*b* and the second memory rank 414-*b* is similar to that of the lengths of the signal transmission paths of the first control signal S1 and the second control signal S2 that transmitted from the processor 120 to first memory rank 112 and a second memory rank 114 in the motherboard 100. For brevity, the details are not repeated herein.

As can be known from the above, each of the memory modules 110, 410-*a* and 410-*b* include a plurality of memory ranks independent of and close to each other, and the memory slots 130, 430-*a* and 430-*b* support the plurality of memory ranks respectively. Therefore, the motherboards 100 and 400 not only support a large memory capacity, but also keep the overclocking stability.

Some terms are used in the specification and the claims to refer to particular elements. However, those skilled in the art should understand that same elements may be referred to by different terms. The specification and the claims are not to be regarded as a way of distinguishing between elements by virtue of differences in name, but rather as a basis for distinguishing between elements by virtue of differences in function. "Comprise", "include" and variants thereof mentioned in the specification and the claims are open-ended terms, and are to be interpreted as "including, but not limited to". In addition, "couple" herein includes any direct and indirect means of connection. Therefore, if a first element is described herein as being coupled to a second element, it indicates that the first element may be directly connected to the second element by electrical or wireless, optical or other signal connection means, or indirectly connected to the second element by other elements or connection means.

The phrase "and/or" as used herein includes one or any combination of a plurality of items listed. In addition, unless otherwise particularly specified in the specification, any term in its singular form encompasses the meaning of its plural form.

The above descriptions are merely preferred embodiments of the disclosure, and any equivalent variation and modification made according to the claims of the disclosure shall fall within the scope of the disclosure.

What is claimed is:

1. A motherboard, comprising:
   a memory module, comprising:
      a first memory rank;
      a second memory rank;
      a plurality of first pins, coupled to the first memory rank; and
      a plurality of second pins, coupled to the second memory rank;
   a processor, comprising a memory channel; and
   a memory slot, coupled between the processor and the memory module, and configured to transmit a first control signal from the memory channel to at least one of the plurality of first pins, or transmit a second control signal from the memory channel to at least one of the plurality of second pins,
   wherein the memory module is inserted in the memory slot,
   wherein the first memory rank receives the first control signal through at least one of the plurality of first pins, and the second memory rank receives the second control signal through at least one of the plurality of second pins,
   wherein the first control signal is transmitted from the processor to the memory slot through a first signal transmission path, the second control signal is transmitted from the processor to the memory slot through a second signal transmission path, the first control signal is transmitted from the memory slot to the first memory rank through a third signal transmission path, and the second control signal is transmitted from the memory slot to the second memory rank through a fourth signal transmission path,
   wherein a difference between a length of the first signal transmission path and a length of the second signal transmission path is X mil, a length of the third signal transmission path is M mil, a length of the fourth signal transmission path is N mil, and the length of the fourth signal transmission path is expressed through a formula as follows:

$$N=M-X+J$$

wherein X, M, N and J are positive numbers, and J is less than or equal to 500.

2. The motherboard according to claim 1, wherein the first control signal is a first chip select signal, the first chip select signal is transmitted to the first memory rank but not transmitted to the second memory rank; and the second control signal is a second chip select signal, the second chip select signal is transmitted to the second memory rank but not transmitted to the first memory rank.

3. The motherboard according to claim 1, wherein the memory module further comprises:
   a plurality of third pins, coupled to the first memory rank and the second memory rank,
   wherein the first memory rank and the second memory rank receive a common control signal through at least one of the plurality of third pins.

4. The motherboard according to claim 3, wherein the common control signal is firstly transmitted to the first memory rank from at least one of the plurality of third pins and then transmitted to the second memory rank, or the common control signal is firstly transmitted to a first node from at least one of the plurality of third pins and then transmitted from the first node to the first memory rank and the second memory rank.

5. A memory module, applicable to a motherboard and comprising:
   a first memory rank;
   a second memory rank;
   a plurality of first pins, coupled to the first memory rank and configured to receive a first control signal; and
   a plurality of second pins, coupled to the second memory rank and configured to receive a second control signal,
   wherein the first memory rank receives the first control signal through at least one of the plurality of first pins, and the second memory rank receives the second control signal through at least one of the plurality of second pins,
   wherein the motherboard comprises a processor and a memory slot, wherein the memory module is inserted in the memory slot, wherein when the memory slot is coupled between the processor and the memory module, the first control signal is transmitted from the processor to the memory slot through a first signal transmission path, the second control signal is transmitted from the processor to the memory slot through a second signal transmission path, the first control signal is transmitted from the memory slot to the first memory rank through a third signal transmission path, and the second control signal is transmitted from the memory slot to the second memory rank through a fourth signal transmission path,
   wherein a difference between a length of the first signal transmission path and a length of the second signal transmission path is X mil, a length of the third signal transmission path is M mil, a length of the fourth signal transmission path is N mil, and the length of the fourth signal transmission path is expressed through a formula as follows:

$$N=M-X+J$$

wherein X, M, N and J are positive numbers, and J is less than or equal to 500.

6. The memory module according to claim 5, wherein the first control signal is a first chip select signal, the first chip select signal is transmitted to the first memory rank but not transmitted to the second memory rank; and the second control signal is a second chip select signal, the second chip select signal is transmitted to the second memory rank and but not transmitted to the first memory rank.

7. The memory module according to claim 5, wherein the memory module further comprises:

a plurality of third pins, coupled to the first memory rank and the second memory rank,
wherein the first memory rank and the second memory rank receive a common control signal through at least one of the plurality of third pins.

8. The memory module according to claim 7, wherein the common control signal is firstly transmitted to the first memory rank from at least one of the plurality of third pins and then transmitted to the second memory rank, or the common control signal is firstly transmitted to a first node from at least one of the plurality of third pins and then transmitted from the first node to the first memory rank and the second memory rank.

* * * * *